(12) United States Patent
Kato et al.

(10) Patent No.: US 10,160,690 B2
(45) Date of Patent: Dec. 25, 2018

(54) SILICON NITRIDE CIRCUIT BOARD AND SEMICONDUCTOR MODULE USING THE SAME

(71) Applicants: KABUSHIKI KAISHA TOSHIBA, Tokyo (JP); TOSHIBA MATERIALS CO., LTD., Yokohama-Shi, Kanagawa-Ken (JP)

(72) Inventors: Hiromasa Kato, Nagareyama Chiba (JP); Noboru Kitamori, Miura Kanagawa (JP)

(73) Assignees: Kabushiki Kaisha Toshiba, Tokyo (JP); Toshiba Materials Co., Ltd., Kanagawa-Ken (JP)

( * ) Notice: Subject to any disclaimer, the term of this patent is extended or adjusted under 35 U.S.C. 154(b) by 0 days.

(21) Appl. No.: 15/554,399

(22) PCT Filed: Jul. 27, 2016

(86) PCT No.: PCT/JP2016/072026
§ 371 (c)(1),
(2) Date: Aug. 29, 2017

(87) PCT Pub. No.: WO2017/056666
PCT Pub. Date: Apr. 6, 2017

(65) Prior Publication Data
US 2018/0057412 A1    Mar. 1, 2018

(30) Foreign Application Priority Data
Sep. 28, 2015 (JP) .................... 2015-189991

(51) Int. Cl.
C04B 35/584 (2006.01)
H01L 23/13 (2006.01)
(Continued)

(52) U.S. Cl.
CPC .......... *C04B 35/584* (2013.01); *C04B 37/025* (2013.01); *C04B 37/026* (2013.01);
(Continued)

(58) Field of Classification Search
CPC ......... H01L 23/13; H01L 23/15; H01L 23/36; H01L 23/3375; H01L 23/49861;
(Continued)

(56) References Cited

U.S. PATENT DOCUMENTS 5,504,372 A * 4/1996 Braden .................. H01L 23/057
257/706
2002/0084103 A1 7/2002 Komatsu et al.
(Continued)

FOREIGN PATENT DOCUMENTS

JP    2000-200865 A    7/2000
JP    2003-309210 A    10/2003
(Continued)

OTHER PUBLICATIONS

International Search Report (in English and Japanese) and Written Opinion of the International Searching Authority (in Japanese) issued in PCT/JP2016/072026, dated Oct. 11, 2016, ISA/JP.
(Continued)

*Primary Examiner* — Yosef Gebreyesus
(74) *Attorney, Agent, or Firm* — Harness, Dickey & Pierce, PLC (57) ABSTRACT

The present invention provides a silicon nitride circuit board in which metal plates are attached on front and rear sides of a silicon nitride substrate having a three-point bending strength of 500 MPa or higher, with attachment layers interposed therebetween, wherein assuming that a thickness of the metal plate on the front side is denoted by t1, and a thickness of the metal plate on the rear side is denoted by t2, at least one of the thicknesses t1 and t2 is 0.6 mm or larger,
(Continued)

a numerical relation: $0.10 \leq |t1-t2| \leq 0.30$ mm is satisfied, and warp amounts of the silicon nitride substrate in a long-side direction and a short-side direction both fall within a range from 0.01 to 1.0 mm. Due to above configuration, TCT properties of the silicon nitride circuit board can be improved even if the thicknesses of the front and rear metal plates are large.

19 Claims, 4 Drawing Sheets

(51) Int. Cl.
```
H01L 23/36      (2006.01)
H05K 1/02       (2006.01)
C04B 37/02      (2006.01)
H01L 23/15      (2006.01)
H05K 1/03       (2006.01)
H05K 3/00       (2006.01)
H01L 23/373     (2006.01)
H01L 23/498     (2006.01)
```
(52) U.S. Cl.
CPC .............. *H01L 23/13* (2013.01); *H01L 23/15* (2013.01); *H01L 23/36* (2013.01); *H01L 23/3735* (2013.01); *H01L 23/49861* (2013.01); *H05K 1/02* (2013.01); *H05K 1/0306* (2013.01); *H05K 3/0011* (2013.01); *C04B 2235/9607* (2013.01); *H05K 1/0271* (2013.01); *H05K 3/0061* (2013.01); *H05K 2201/09136* (2013.01)

(58) Field of Classification Search
CPC ...... H05K 1/02; H05K 1/0306; H05K 3/0011; H05K 3/0061; H05K 1/0271; H05K 2201/09136; C04B 37/025; C04B 37/026; C04B 2235/9607; C04B 35/584
See application file for complete search history.

(56) References Cited

U.S. PATENT DOCUMENTS

| | | |
|---|---|---|
| 2008/0043127 A1* | 2/2008 | Mochizuki ........ H01L 27/14618 348/294 |
| 2009/0056996 A1 | 3/2009 | Kato et al. |
| 2009/0101392 A1 | 4/2009 | Kaga et al. |
| 2012/0305304 A1 | 12/2012 | Kato et al. |
| 2013/0135824 A1* | 5/2013 | Harubeppu ............. H01L 23/34 361/709 |
| 2014/0291699 A1 | 10/2014 | Yano et al. |
| 2014/0354617 A1* | 12/2014 | Nam ..................... G06F 3/0414 345/212 |
| 2015/0382506 A1* | 12/2015 | Yamada .............. H01L 23/3735 361/699 |
| 2018/0019182 A1* | 1/2018 | Kato .................... H01L 21/4807 |

FOREIGN PATENT DOCUMENTS

| | | |
|---|---|---|
| JP | 2004-311685 A | 11/2004 |
| JP | 3797905 B2 | 4/2006 |
| JP | 2007-230791 A | 9/2007 |
| JP | 2010-118682 A | 5/2010 |
| JP | 2013-042165 A | 2/2013 |
| WO | WO-2007-105361 A1 | 9/2007 |
| WO | WO-2013-094213 A1 | 6/2013 |

OTHER PUBLICATIONS

English translation of International Preliminary Report on Patentability dated Apr. 3, 2018, including English translation of ISA Written Opinion dated Oct. 11, 2016, in corresponding International Patent Application No. PCT/JP2016/072026.

\* cited by examiner

SILICON NITRIDE CIRCUIT BOARD AND SEMICONDUCTOR MODULE USING THE SAME

CROSS REFERENCE TO RELATED APPLICATIONS

This application is a U.S. National Phase Application under 35 U.S.C. 371 of International Application No. PCT/JP2016/072026 filed on Jul. 27, 2016 and published in Japanese as WO 2017/056666 on Apr. 6, 2017. This application is based on and claims the benefit of priority from Japanese Patent Application No. 2015-189991 filed Sep. 28, 2015. The entire disclosures of all of the above applications are incorporated herein by reference.

TECHNICAL FIELD

An embodiment described herein generally relates to a silicon nitride circuit board and a semiconductor module using the silicon nitride circuit board.

BACKGROUND ART

In recent years, development of high power modules such as high-power high-efficiency inverters has been underway with an increase in performance of industrial equipment such as robots and motors. In proportion to implementation of these high power modules, heat generated from semiconductor elements is steadily increasing. To dissipate (radiate) the heat efficiently, various methods are adopted for high power modules. Recently, use has been made of a ceramic circuit board comprising metal plates attached (bonded) on both sides of a ceramic substrate.

As the ceramic circuit board, the circuit boards described in WO 2007/105361 (Patent Document 1), Japanese Patent Laid-Open No. 2010-118682 (Patent Document 2) are developed. According to Patent Document 1, it is reported that an improved TCT property (thermal cycling test property) is given by performing control of a thickness ratio between a metal plate on a front side (first metal plate) and a metal plate on a rear side (second metal plate) to 50% or larger and 200% or smaller.

According to Patent Document 2, a ceramic circuit board that warps so as to be convex toward a metal plate on a front side (on a metal circuit plate side) is reported. According to Patent Document 2, by adopting such a structure, an improved solder flow property is given. It is reported that, by adopting a ceramic circuit board such as that described in Patent Document 1 or Patent Document 2, a TCT property and a solder flow property are improved.

In recent years, with an increase in power of semiconductor elements, a further improvement of a heat dissipation property (heat radiating property) is demanded. In a semiconductor module, a semiconductor element is mounted on a ceramic circuit board with a solder layer interposed therebetween. In such a module structure, a heat transfer path is as follows: semiconductor element→solder layer-→metal plate (metal plate on the front side)→ceramic substrate→metal plate (metal plate on the rear side).

One of indexes indicating a heat dissipation property of a ceramic circuit board is thermal resistance. A lower thermal resistance indicates a better heat dissipation property. A thermal resistance (Rth) is determined as $Rth=H/(k \times A)$. Here, H represents heat transfer path, k represents thermal conductivity, and A represents heat dissipation area. Decreasing the thermal resistance (Rth) demands shortening the heat transfer path (H), increasing the thermal conductivity (k), or increasing the heat dissipation area (A).

Moreover, improvement of a TCT property (thermal cycling test property) is also demanded of ceramic circuit boards. Japanese Patent No. 3797905 (Patent Document 3) reports that a silicon nitride substrate having a three-point bending strength of 500 MPa or higher is developed. Use of such a silicon nitride substrate having a high mechanical strength allows improvement of the TCT property.

To cope with the increase in power of the module mentioned before, further improvement of the heat dissipation property and the TCT property are demanded. To improve the heat dissipation property by using a high-strength silicon nitride substrate, it is effective to increase the heat dissipation area (A).

Meanwhile, to shorten the heat transfer path (H), it is effective to reduce thicknesses of a metal circuit plate and a ceramic substrate. However, an excessive reduction of the thickness of a metal circuit plate makes it difficult to flow large current. An excessive reduction of the thickness of a ceramic substrate causes concern about an insulation property.

As to the thermal conductivity (k), an aluminum nitride substrate having a thermal conductivity to a degree of 250 W/m·K has been developed. However, the aluminum nitride substrate has the drawback that its three-point bending strength is only about 250 MPa and thus it is poor in TCT property.

Examples of effective methods to increase the heat dissipation area (A) include a method to enlarge a metal plate to be attached (bonded) to a ceramic substrate, and a method to attach a leadframe, a cooling fin, and the like.

PRIOR ART DOCUMENTS

Patent Documents

Patent Document 1: International Publication No. 2007/105361
Patent Document 2: Japanese Patent Laid-Open No. 2010-118682
Patent Document 3: Japanese Patent No. 3797905

SUMMARY OF THE INVENTION

Problems to be Solved by the Invention

According to Patent Document 1, as illustrated in [Table 1], a thickness ratio between the metal plates attached on the front side and the rear side of a ceramic substrate is changed within a range from 50 to 250%. Meanwhile, a conventional semiconductor module is attached to a cooling fin with a base plate interposed therebetween, the base plate being attached on the rear side of a silicon nitride circuit board. Additionally, the silicon nitride circuit board and the cooling fin are attached to each other and integrated together into a screwed structure.

In a case where the semiconductor module is attached to the cooling fin with the above base plate interposed therebetween, a heat transfer path (H) is lengthened, and a thermal resistance (Rth) is increased. Therefore, an experiment is being conducted on a structure in which the rear face of a silicon nitride circuit board is directly attached and screwed to a cooling fin without using a base plate. When the structure of direct attachment and screwing to a cooling fin was adopted to the silicon nitride circuit board according to Patent Document 1, the silicon nitride circuit board was warped. In addition, attaching a leadframe to improve a heat dissipation property resulted in a similar problem of occurrence of a warp in the silicon nitride circuit board.

As seen from the above, direct provision of a leadframe or a cooling fin on the metal plate provided on the front side or the rear side in the conventional silicon nitride circuit board causes a fault that the warp of the silicon nitride substrate increases.

Means for Solving the Problems

The silicon nitride circuit board according to an embodiment is a silicon nitride circuit board in which metal plates are attached on front and rear sides of a silicon nitride substrate having a three-point bending strength of 500 MPa or higher, wherein assuming that a thickness of the metal plate on the front side is denoted by t1, and a thickness of the metal plate on the rear side is denoted by t2, at least one of the thicknesses t1 and t2 is equal to or larger than 0.6 mm, a numerical relation $0.10 \leq |t1-t2| \leq 0.30$ mm is satisfied, and warp amounts of the silicon nitride substrate in a long-side direction and a short-side direction both fall within a range from 0.01 to 1.0 mm.

DESCRIPTION OF EMBODIMENT

The silicon nitride circuit board according to an embodiment is a silicon nitride circuit board in which metal plates are attached on front and rear sides of a silicon nitride substrate having a three-point bending strength of 500 MPa or higher, wherein assuming that a thickness of the metal plate on the front side is denoted by t1, and a thickness of the metal plate on the rear side is denoted by t2, at least one of the thicknesses t1 and t2 is equal to or larger than 0.6 mm, a numerical relation: $0.10 \leq |t1-t2| \leq 0.30$ mm is satisfied, warp amounts of the silicon nitride substrate described above in a long-side direction and a short-side direction both fall within a range from 0.01 to 1.0 mm.

The silicon nitride substrate is one having a three-point bending strength of 500 MPa or higher. When the three-point bending strength is as low as less than 500 MPa, a TCT property of the silicon nitride substrate decreases. The three-point bending strength is preferably 500 MPa or higher, further, 600 MPa or higher. The silicon nitride substrate preferably has a fracture toughness value of 6.0 MPa·m$^{1/2}$ or higher.

The silicon nitride substrate preferably has a thermal conductivity of 50 W/m·K or higher. The thermal conductivity is preferably further 60 W/m·K or higher, further 80 W/m·K or higher. Increasing the thermal conductivity of the silicon nitride substrate allows a thermal resistance of the whole silicon nitride circuit board to be lowered.

The silicon nitride substrate preferably has a thickness of 0.50 mm or smaller. Further, a thickness reduction down to 0.33 mm or smaller, or 0.26 mm or smaller, is preferably performed. The silicon nitride substrate is high-strength and excellent in insulation property, which enables the thickness reduction of the substrate. Performing the thickness reduction of the substrate allows the thermal resistance of the circuit board to be lowered. The lower limit of the thickness of the silicon nitride substrate is preferably 0.10 mm or larger. If the substrate has a thickness as small as less than 0.10 mm, it may be difficult to secure the strength and insulation property of the silicon nitride substrate.

On both sides of the silicon nitride substrate, metal plates are attached (bonded). The metal plates are preferably copper plates, aluminum plates, copper alloy plates, or aluminum alloy plates. A method for the attachment may be one in which attachment layers are interposed between the silicon nitride substrate and the metal plates, respectively, or one in which the metal plates are directly attached to the silicon nitride substrate with no attachment layers interposed therebetween. The method for the attachment using the attachment layers interposed is preferably an active metal brazing method in which an active metal brazing material is used. The active metal brazing material preferably comprises silver (Ag), copper (Cu), and titanium (Ti). Moreover, tin (Sn) and indium (In) are supposed to be added to the active metal brazing material as necessary. Examples of the active metal brazing material are the brazing material that include one that contains 40 to 80% by mass of Ag, 20 to 60% by mass of Cu, 0.1 to 12% by mass of Ti, 20% by mass or less (0 included) of Sn, and 20% by mass or less (0 included) of In. In a case where the metal plates are copper plates or copper alloy plates, the attachment is advantageously made easier by the active metal brazing method.

In a case where the metal plates are Al plates or Al alloy plates, Al (aluminum) is an active metal. Examples of a component other than the active metal include Si (silicon). Examples of an active metal brazing material in this case is one that contains 0.01 to 10% by mass of Si, and Al as the remainder.

Assuming that, of the metal plates attached on the front and rear sides, the metal plate on the front side has a thickness of t1, and the metal plate on the rear side has a thickness of t2, a numerical relation $0.10 \leq |t1-t2| \leq 0.30$ mm is to be satisfied. The satisfaction of $0.10 \leq |t1-t2| \leq 0.30$ mm indicates that a difference in thickness between the metal plate on the front side and the metal plate on the rear side is 0.10 mm or larger and 0.30 mm or smaller. The difference in thickness between the metal plate on the front side and the metal plate on the rear side is preferably 0.10 mm or larger and 0.25 mm or smaller. Specifying the difference in thickness within this range allows warp amounts $S_{L1}$, $S_{L2}$, and $S_{L3}$ in the respective directions to be controlled within a given range.

Any one of the metal plates on the front side and the rear side may be thicker than another one. The metal plate on the front side is preferably a metal plate on which a semiconductor element is mounted, and the metal plate on the rear side is preferably a heat dissipation plate. To give an additional current-carrying capacity, the metal plate on the front side is preferably increased in thickness. To provide a good heat dissipation property, the metal plate on the rear side is preferably increased in thickness.

It is necessary to set at least one of the thickness t1 of the front metal plate and the thickness t2 of the rear metal plate at 0.6 mm or larger. In addition, at least one of the thicknesses t1 and t2 is preferably 0.8 mm or larger. The thicknesses of the metal plates have any upper limit, which is however preferably 5.00 mm or smaller. A thickness of the metal plates exceeding 5.00 mm results in an increase in volume change caused by thermal expansion of the metal plates, which makes it difficult to control a warp amount to be described later.

A feature of the silicon nitride substrate is that, in this state, warp amounts in both of a long-side direction and a short-side direction fall within a range from 0.01 to 1.0 mm.

Figure 1:
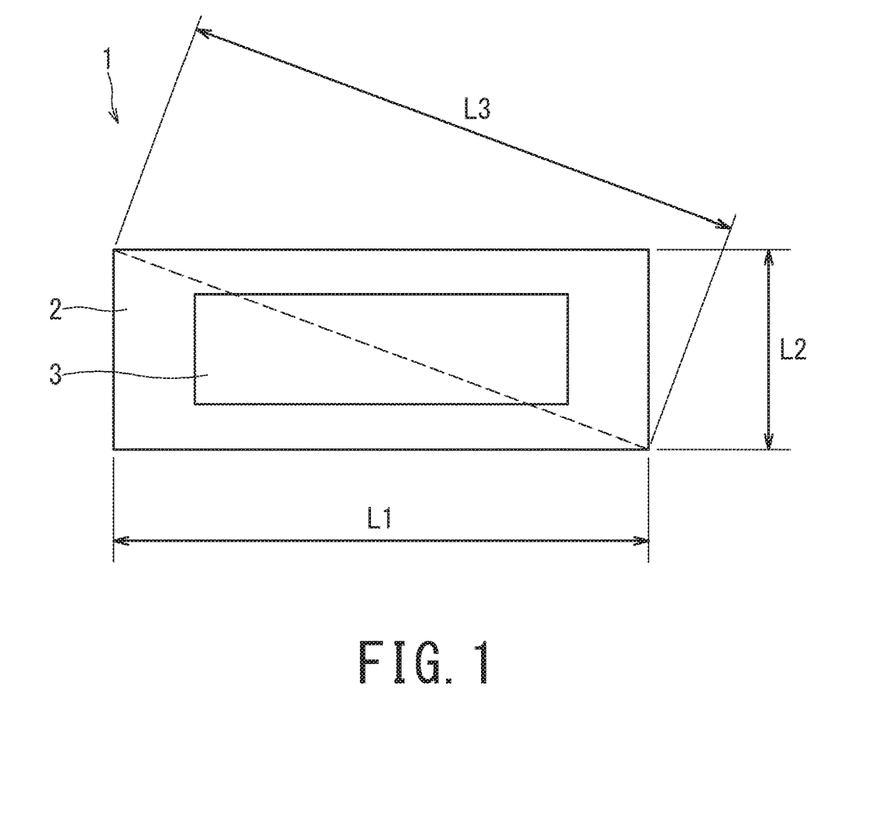
FIG. 1 is a top view illustrating a configuration example of a silicon nitride circuit board according to an embodiment.
Figure 2:
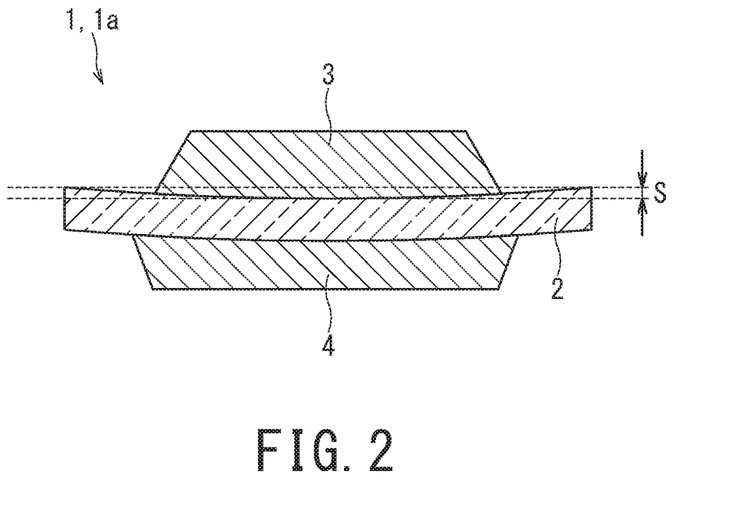
FIG. 2 is a lateral cross sectional view illustrating a configuration example of the silicon nitride circuit board according to the embodiment.
Figure 3:
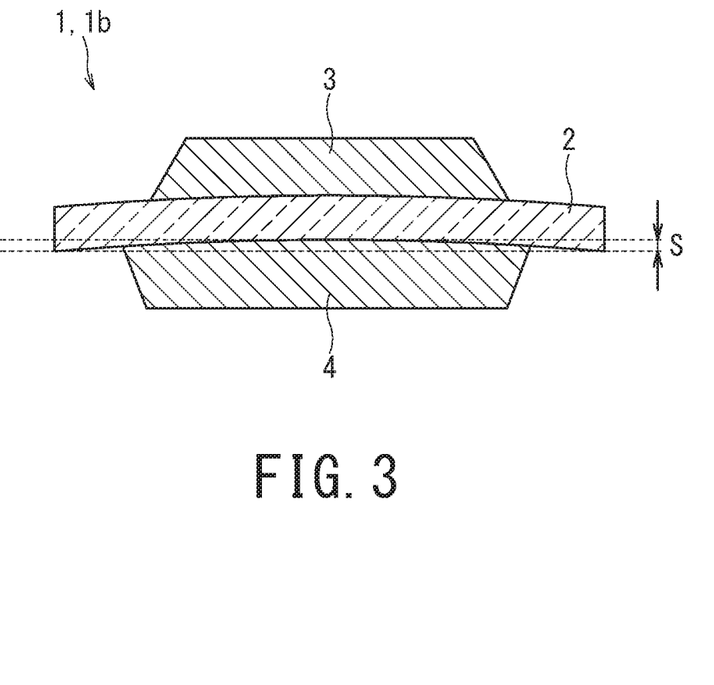
FIG. 3 is a lateral cross sectional view illustrating another configuration example of the silicon nitride circuit board according to the embodiment.

FIG. 1, FIG. 2, and FIG. 3 illustrate a configuration example of the silicon nitride circuit board according to the embodiment. FIG. 1 is top view, and FIG. 2 and FIG. 3 are lateral cross sectional views. In the drawings, reference numeral 1 denotes the silicon nitride circuit board, reference numeral 2 denotes the silicon nitride substrate, reference numeral 3 denotes the metal plate on the front side (the front metal plate), and a metal plate 4 denotes the metal plate on the rear side (the rear metal plate). Reference character L1 denotes a length of the silicon nitride substrate 2 in a long-side direction (longitudinal width), reference character L2 denotes a length of the silicon nitride substrate 2 in a short-side direction (transverse width), and reference character S denotes a warp amount of the silicon nitride substrate 2. A warp amount of the silicon nitride substrate 2 in the long-side direction is denoted by $S_{L1}$, and a warp amount of the silicon nitride substrate in the short-side direction is denoted by $S_{L2}$. As illustrated in FIG. 1, reference character L3 is a length of a diagonal line of the silicon nitride substrate 2. In addition, although not being illustrated, $S_{L3}$ denotes a warp amount of the silicon nitride substrate in a diagonal line direction.

A method for measuring the warp amount S is as follows. First, a straight line is drawn from one of opposite edges of the silicon nitride substrate 2 to another one. The warp amount S is determined as a distance at which the silicon nitride substrate 2 is most away from the straight line. In the silicon nitride circuit board 1 according to the embodiment, the warp amount $S_{L1}$ in the long-side direction and the warp amount $S_{L2}$ in the short-side direction both fall within a range from 0.01 to 1.0 mm. The warp amount $S_{L1}$ and the warp amount $S_{L2}$ preferably fall from 0.1 to 0.5 mm.

The warp amount $S_{L3}$ of the silicon nitride substrate 2 in the diagonal line direction preferably falls within a range of $0.1 \leq S_{L3} \leq 1.5$ mm. The warp amount $S_{L3}$ more preferably falls within a range of $0.2 \leq S_{L3} \leq 0.7$ mm.

The leadframe is attached mainly for the purpose of continuity of the semiconductor element. Therefore, the leadframe is often extended to an outside of the silicon nitride circuit board 1. The heat sink and the cooling fin are attached on the rear side of the silicon nitride circuit board 1. The heat sink and the cooling fin are attached regularly on the rear side. Meanwhile, the leadframe is attached to a spot where a continuity is intended.

Therefore, the leadframe is not always disposed regularly. Setting the warp amount $S_{L3}$ in the diagonal line direction at 0.1 to 1.5 mm makes it possible to set the warp amount of the silicon nitride substrate 2 in an electronic component module at less than 0.1 mm (0 mm included) even when the leadframe is disposed irregularly. In other words, a silicon nitride circuit board 1 having a warp amount $S_{L3}$ set within a range of $0.1 \leq S_{L3} \leq 1.5$ mm is suitable for those to which leadframe are attached. The term "to dispose regularly" refers to dispositions of left-right symmetry.

FIG. 2 illustrates a structure in which the silicon nitride substrate warps so as to be convex on a rear metal plate side. A circuit board having such a structure will be referred to as a first silicon nitride circuit board. In the first silicon nitride circuit board, t1>t2 is preferably established.

FIG. 3 illustrates a structure in which the silicon nitride substrate warps so as to be convex on a front metal plate side. A circuit board having such a structure will be referred to as a second silicon nitride circuit board. Reference character 1a in FIG. 2 denotes the first silicon nitride circuit board, and reference character 1b in FIG. 3 denotes the second silicon nitride circuit board. In the second silicon nitride circuit board 1b, t1<t2 is preferably established. In other words, if t1>t2 is established, the silicon nitride substrate is easily controlled to have a structure in which the silicon nitride substrate warps so as to be convex on the rear metal plate side. Similarly, if t1<t2 is established, the silicon nitride substrate is easily controlled to have a structure in which the silicon nitride substrate warps so as to be convex on the front metal plate side.

The silicon nitride circuit board according to the embodiment has given warp amounts in both of the long-side direction and the short-side direction. By adopting such a structure, the silicon nitride circuit board exerts an excellent TCT property even when a different in thickness between the front and rear metal plates is 0.10 mm or larger and 0.30 mm or smaller.

Figure 4:
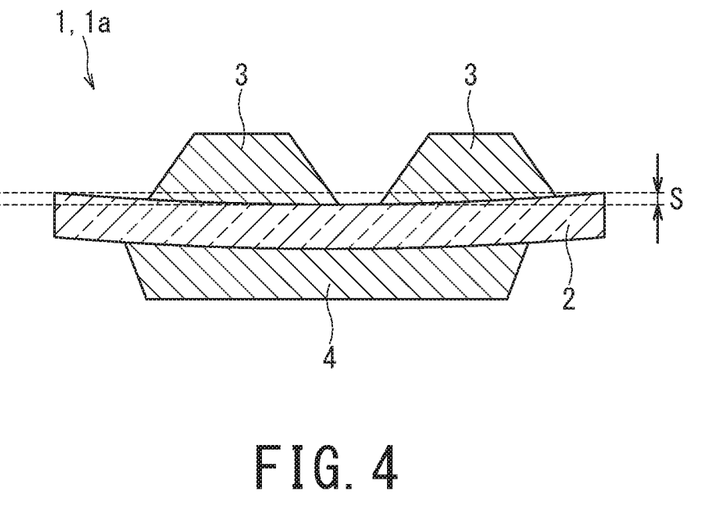
FIG. 4 is a lateral cross sectional view illustrating yet another configuration example of the silicon nitride circuit board according to the embodiment.

In each of the first silicon nitride circuit board 1a and the second silicon nitride circuit board 1b, at least one of the front and rear faces may include a plurality of metal plates attached thereto. FIG. 4 illustrates the silicon nitride circuit board 1a to a front side of which two metal plates 3 and 3 are attached. In the drawing, reference numeral 1 denotes the silicon nitride circuit board, reference numeral 2 denotes the silicon nitride substrate, reference numeral 3 denotes front metal plates, reference numeral 4 denotes a rear metal plate, and reference character S denotes a warp amount of the silicon nitride substrate 2. Although FIG. 4 illustrates the first silicon nitride circuit board 1a, the second silicon nitride circuit board 1b may be illustrated. Although FIG. 4 illustrates the silicon nitride circuit board in which the number of metal circuit plates (the front metal plates) 3 and 3 is two, a plurality (three or more) of metal circuit plates may be provided.

Figure 5:
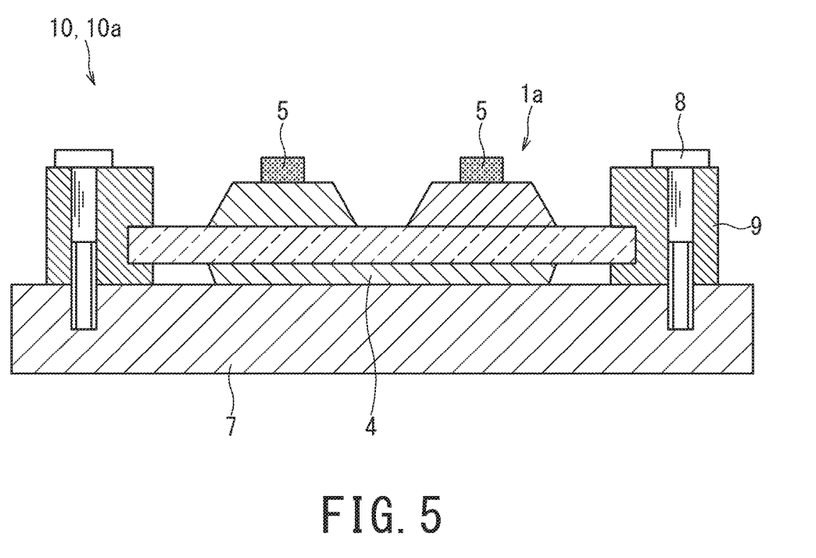
FIG. 5 is a lateral cross sectional view illustrating a configuration example of the semiconductor module according to the embodiment.

The first silicon nitride circuit board 1a is suitable for a semiconductor module to a rear metal plate of which a cooling fin is attached. FIG. 5 illustrates an example of such a semiconductor module. In the drawing, reference numeral 10 denotes the semiconductor module, reference character 1a denotes the first silicon nitride circuit board, reference numeral 4 denotes a heat dissipation plate (the rear metal plate), reference numeral 5 denotes semiconductor elements, reference numeral 7 denotes the cooling fin, reference numeral 8 denotes screws, and reference numeral 9 denotes screw receiving portions. The semiconductor module 10 including the first silicon nitride circuit board 1a will be referred to as a first semiconductor module 10a.

With a warping direction of the silicon nitride circuit board 1a set so that the silicon nitride circuit board 1a is convex on the rear metal plate side, a warp amount $S_{L1}$ in a long-side direction and a warp amount $S_{L2}$ in a short-side direction are both set at 0.01 to 1.0 mm. With such a structure, the warp amounts of the silicon nitride substrate 2 can be decreased even when a cooling fin is attached thereto, as will be described below.

Figure 6:
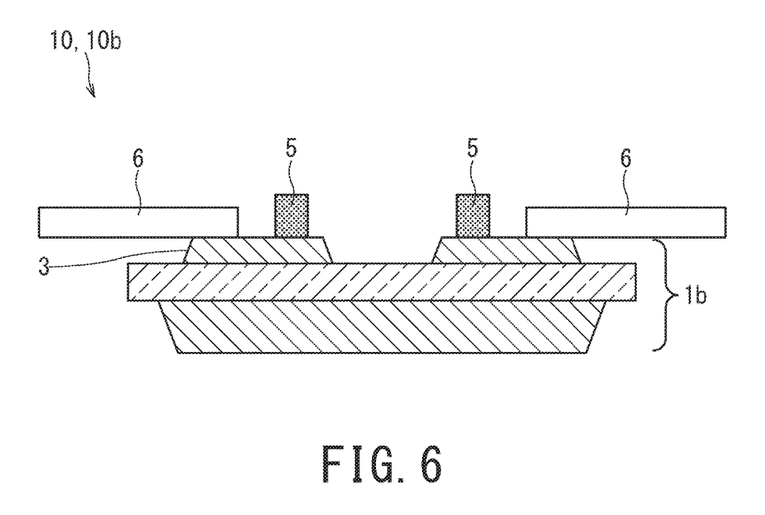
FIG. 6 is a lateral cross sectional view illustrating another configuration example of the semiconductor module according to the embodiment.

The second silicon nitride circuit board 1b is suitable for a semiconductor module to front metal plates 3 and 3 of which leadframes 6 and 6 are attached. FIG. 6 illustrates a configuration example of the semiconductor module. In the drawing, reference numeral 10 denotes the semiconductor module, reference character 1b denotes the second silicon nitride circuit board, reference numeral 3 denotes the front metal plates (metal circuit plates), reference numeral 5 denotes semiconductor elements, and reference numeral 6 denotes the leadframes. The semiconductor module 10 including the second silicon nitride circuit board 1b will be referred to as a second semiconductor module 10b.

With a warping direction of the silicon nitride circuit board 1b set so that the silicon nitride circuit board 1b is convex toward the front metal plate side, a warp amount $S_{L1}$ in a long-side direction and a warp amount $S_{L2}$ in a short-side direction are both set at 0.01 to 1.0 mm. With such a structure, the warp amounts of the silicon nitride substrate 2 can be decreased even when leadframes having a thickness of 0.2 mm or larger are attached thereto, as will be described below.

The longitudinal width L1 of the silicon nitride substrate 2 is preferably 10 to 200 mm. The transverse width L2 of the silicon nitride substrate is preferably 10 to 200 mm. If the longitudinal width (L1) or the transverse width (L2) is short, being shorter than 10 mm, a footprint (mounting area) of a semiconductor element on the metal plate on the front side becomes small, and flexibility of design is decreased. In addition, it becomes difficult to form an area in which a bulging-out region of an attachment layer to be described later is provided. On another hand, if the longitudinal width (L1) or the transverse width (L2) is long, being longer than 200 mm, it becomes difficult to control the warp amount (S) so that the warp amount (S) falls within a predetermined range.

A ratio $(S_{L1}/S_{L2})$ between the warp amount $(S_{L1})$ in the long-side direction and the warp amount $(S_{L2})$ in the short-side direction preferably falls within a range from 0.5 to 5.0. The ratio $(S_{L1}/S_{L2})$ falling within the range from 0.5 to 5.0 indicates that the warp amounts in the long-side direction and the short-side direction are close to each other. By adopting such a structure, a TCT property can be improved even when the difference in thickness between the metal plates on the front and rear sides becomes 0.10 mm or larger and 0.30 mm or smaller.

The metal plate is preferably attached to the silicon nitride substrate through an attachment layer containing an active metal. The active metal refers to at least one of elements selected from Ti (titanium), Zr (zirconium), Hf (hafnium), Nb (niobium), and Al (aluminum). Of these active metals, Ti is preferably used, as mentioned before. The attachment layer (bonding layer) containing the active metal is preferably one that is formed by making use of an active metal brazing material that contains 40 to 80% by mass of Ag, 20 to 60% by mass of Cu, 0.1 to 12% by mass of Ti, 20% by mass or less (0 included) of Sn, and 20% by mass or less (0 included) of In. The attachment is made by interposing an active metal brazing material layer between the silicon nitride substrate and the metal plate and performing heat treatment. After the attachment, the active metal contained in the attachment layer is preferably mainly made of an active metal nitride.

Figure 7:
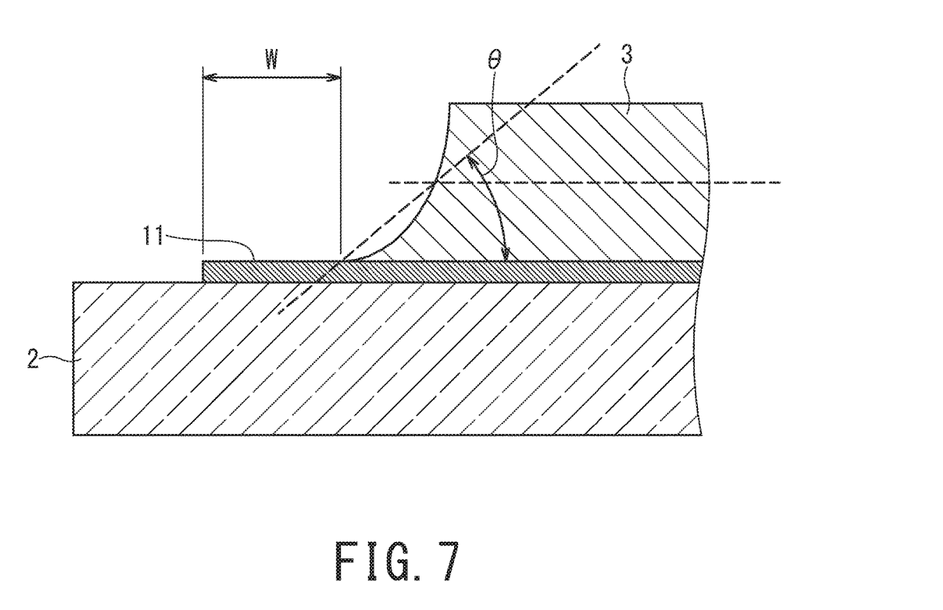
FIG. 7 is a lateral cross-sectional view illustrating a configuration example of a side surface of a metal plate of the silicon nitride circuit board according to the embodiment.

The attachment layer is preferably formed so as to bulge out from an edge portion of the metal plate. A bulging-out amount of the attachment layer bulging out from the edge portion of the metal plate is preferably 10 to 150 μm. FIG. 7 illustrates a partial cross-sectional view of a configuration example of the silicon nitride circuit board in which the attachment layer includes a bulging-out portion. In the drawing, reference numeral 2 denotes the silicon nitride substrate, reference numeral 3 denotes the metal plate, and reference numeral 11 denotes the bulging-out portion of the attachment layer. Reference character W denotes a length of the bulging-out portion of the attachment layer. The inclusion of the bulging-out portion 11 enables mitigation of thermal stress on the metal plate 3 and the silicon nitride substrate 2.

On the side surface of the metal plate 3, when a straight line is drawn from a point of ½ thickness of the metal plate to an edge portion of the metal plate on a silicon nitride substrate 2 side, an angle θ between the straight line and a horizontal line (substrate surface) is preferably 80° or smaller. FIG. 7 illustrates an example of a lateral section of the metal plate 3 of the silicon nitride circuit board according to the embodiment. In the drawing, reference numeral 2 denotes the silicon nitride substrate, reference numeral 3 denotes the metal plate, and reference numeral 11 denotes the bulging-out portion of the attachment layer.

An angle θ on a side surface of the metal plate 3 can be recognized by cutting the silicon nitride circuit board in a direction perpendicular to its long-side direction, polishing a cut surface, and observing the cut surface under a scanning electron microscope (SEM) or a metallurgical microscope, or using a CCD camera, with a magnification that allows an overall thickness of the metal plate to be recognized. On an observation image or an observation picture, a straight line is drawn from a point of ½ thickness of the metal plate 3 to an edge portion of the metal plate on a silicon nitride substrate side, and the angle θ between the straight line and the silicon nitride substrate surface is measured.

An angle θ being 80° or smaller indicates a shape of the side surface of the metal plate extending in a direction toward the silicon nitride substrate side. This cross-sectional shape enables mitigation of thermal stress on the metal plate and the silicon nitride substrate. Therefore, the angle θ of the straight line is preferably 80° or smaller, further 60° or smaller.

The angle θ does not have any particular lower limit but is preferably 30° or larger. If the angle θ is smaller than 30°, the side surface of the metal plate is made excessively long. When the side surface is made excessively long, a flat area of a surface of the metal plate is made small on condition that a size of the metal plate is unchanged. When the flat area is made small, an area that allows a semiconductor element to be mounted is made small. Alternatively, if the flat area is unchanged in this case, the metal plate needs to be large.

Proper combination of the bulging-out portion of the attachment layer and the angle θ allows a further mitigation of the thermal stress.

Thus, the TCT property can be improved even when the thickness of the metal plate is increased, or a difference in thickness between the metal plates on the front and rear sides (|t1−t2|) is provided. In addition, if the length W of the bulging-out portion 11 is shorter than 10 μm, an effect of providing the bulging-out portion becomes insufficient. If the length W of the bulging-out portion 11 is long exceeding 150 μm, manufacture thereof becomes easy, but additional effects are few. In addition, an insulation distance between adjacent metal circuit plates becomes short, which may cause a faulty continuity. Furthermore, to secure a sufficient insulation distance, it becomes necessary to increase a size of the entire circuit board, which can be an adverse factor for properties and cost. Therefore, the length W of the bulging-out portion 11 is preferably 10 to 150 μm, further 15 to 60 μm. The angle θ is preferably 80° or smaller, further 60° or smaller. This configuration enables the mitigation of the thermal stress, improving the TCT property.

A thermal resistance (Rth) is determined by the expression Rth=H/(k×A). Here, H represents heat transfer path, k represents thermal conductivity, and A represents heat dissipation area. Decreasing the thermal resistance (Rth) involves shortening the heat transfer path (H), increasing the thermal conductivity (k), and increasing the heat dissipation area (A).

In the silicon nitride circuit board according to the embodiment, by performing thickness reduction of the silicon nitride substrate, it is possible to shorten a heat transfer path of a portion a thermal conductivity of which is low. By increasing the thickness of the metal plate or increasing a size of the metal plate, it is possible to increase the thermal conductivity (k) and the heat dissipation area (A) of the silicon nitride circuit board. Consequently, the thermal resistance (Rth) can be decreased.

The difference in thickness between the metal plates on the front side or the rear side is specified so that numerical relation: 0.10 mm≤|t1−t2|0.30 mm is satisfied. By increasing the thickness of the metal plate on the front side, it is possible to give an additional current-carrying capacity. By increasing the thickness of the metal plate on the rear side, it is possible to provide a broad emission path of heat, allowing an improved heat dissipation property.

A silicon nitride circuit board such as the one above is suitable for a semiconductor module on which a high-output semiconductor element is mounted. Since the silicon nitride circuit board according to the embodiment has a decreased thermal resistance and an improved TCT property, the silicon nitride circuit board is suitable for a semiconductor element having a high junction temperature. An SiC device and a GaN device have high junction temperatures being 175° C. or higher. In other words, the silicon nitride circuit board according to the present embodiment is suitable for a semiconductor module on which a SiC device or a GaN device is mounted.

In the second semiconductor module 10b using the second silicon nitride circuit board 1b, the leadframes 6 and 6 are attached to the front metal plate. Each leadframe 6 preferably has a thickness of 0.2 mm or larger. Furthermore, each leadframe 6 preferably has a thickness of 0.4 mm or larger. In addition, by increasing the thickness of the leadframe to be 0.2 mm or larger, it is possible to give an additional current-carrying capacity and give an improved heat dissipation property. The thickness of the leadframe 6 has any upper limit, which is however preferably 5 mm or smaller. In addition, each leadframe is preferably made up of a metal plate such as a copper plate.

In the second silicon nitride circuit board 1b, the warp amount $S_{L1}$ in the long-side direction and the warp amount $S_{L2}$ in the short-side direction are specified to fall within a range from 0.01 to 1.0 mm. Therefore, the warp amount of the silicon nitride substrate can be made smaller than 0.1 mm (0 mm included) even when leadframes each having a thickness of 0.2 mm or larger are attached to the front metal plate. In a silicon nitride circuit board in which only a warp amount ($S_{L1}$) in a long-side direction is controlled as in conventional practice, a silicon nitride substrate is easily bent when a leadframe is attached thereto.

When the second semiconductor module 10b including the leadframes attached thereto is manufactured, the silicon nitride substrate 2 is not bent, which makes the warp amount small. Reduction of the warp amount of the silicon nitride substrate in the semiconductor module allows a TCT property required of the semiconductor module to be improved. In addition, a poor mounting at the time of mounting the semiconductor module itself can be prevented from occurring.

Controlling the warp amount $S_{L3}$ in the diagonal line direction within a range from 0.1 to 1.5 mm makes it easy to control the warp amount of a silicon nitride substrate to be smaller than 0.1 mm (0 mm included) even when the leadframes are disposed irregularly.

Adopting such a structure enables a structure that dispenses with wire bonding. By not adopting a wire bonding structure, it is possible to prevent a wire from being broken in performing resin sealing by a transfer molding method. In other words, the silicon nitride circuit board according to the present embodiment is suitable for a semiconductor module that is subjected to resin sealing such as a transfer molding method.

In the transfer molding method, a semiconductor module is disposed in a heated mold. The semiconductor module is disposed in a space called a cavity. The mold is made up of upper and lower molds as a set, defining the cavity. Next, a resin tablet (resin in a hardened form) is charged into a space called a pot. The resin tablet charged into the pot starts to melt gradually and is charged into the cavity. With the resin in a liquid state, a space around an electronic component is filled. When the filled resin is hardened, the electronic component is brought into a molded state.

The transfer molding method allows a molding process to be performed on a lot of electronic component modules by increasing a size of a mold and thus is a resin sealing method excellent in mass productivity. Meanwhile, the transfer molding method is a manufacturing method in which a wire is likely to deform or to be broken. Therefore, by adopting the structure dispensing with wire bonding, it is possible to eliminate a break failure or a deformation failure of a wire in performing resin sealing by a transfer molding method. Although description is made about the advantage of dispensing with wire bonding, continuity of the semiconductor element may be provided by wire bonding.

The first semiconductor module 10a including a first silicon nitride circuit board 1a is a semiconductor module including the rear metal plate to which the cooling fin is attached. The cooling fin preferably has a thickness of 0.2 mm or larger. The cooling fin more preferably has a thickness of 0.4 mm or larger. The thickness of the cooling fin does not have any particular upper limit but is preferably 20 mm or smaller. The cooling fin may be in various shapes such as a plate shape, a comb shape, a groove shape, and a pin shape.

As illustrated in FIG. 5, the first silicon nitride circuit board 1a is suitable for a structure in which the first silicon nitride circuit board 1a is screwed to the cooling fin 7. The first silicon nitride circuit board 1a is provided with a warp amount that makes the first silicon nitride circuit board 1a convex on the rear metal plate side. With such a structure, the warp amount of the silicon nitride substrate 2 in the first semiconductor module 10a can be decreased. Therefore, it is possible to improve adhesiveness (tightly bonding property) between the rear metal plate 4 of the silicon nitride substrate 2 and the cooling fin 7.

This improvement in adhesiveness allows improvement of heat dissipation property. In addition, this improvement in adhesiveness allows the silicon nitride substrate to be prevented from being bent when the screwed structure is applied. Since the first silicon nitride circuit board 1a has a controlled warp amount ($S_{L1}$) in the long-side direction and a controlled warp amount ($S_{L2}$) in the short-side direction, the first silicon nitride circuit board 1a is suitable for a structure to which the cooling fin 7 is attached or screwed. The warp amount of the silicon nitride substrate 2 in the first semiconductor module 10a can be made smaller than 0.1 mm (0 mm included). In a silicon nitride circuit board in which only a warp amount ($S_{L1}$) in a long-side direction is controlled as in conventional practice, a silicon nitride substrate is easily bent when a structure to which the cooling fin is attached or screwed is applied to the silicon nitride circuit board.

For the second semiconductor module 10b, a volume ratio of (Volume of portion of leadframe attached to front metal plate+Volume of front metal plate)/(Volume of rear metal plate) preferably falls within a range from 0.6 to 1.5. If the volume ratio falls out of this range, it may be difficult to make the warp amount of the silicon nitride substrate smaller than 0.1 mm (0 mm included) when the silicon nitride substrate is built in the semiconductor module.

For example, assume that, in a leadframe of 30 mm long by 10 mm wide by 0.5 mm thick, a portion attached to the front metal plate is 10 mm long by 10 mm wide. A volume of the portion of the leadframe attached to the front metal plate is 10 mm long by 10 mm wide by 0.5 mm thick=50 mm$^3$.

In a case of attaching a plurality of leadframes, a value obtained by summing up calculated volumes of the respective attached portions of the leadframes is determined as the "Volume of portion of leadframe attached to front metal plate". In a case of attaching a plurality of front metal plates, a value obtained by summing up volumes of the respective front metal plates is determined as the "Volume of front metal plate". Similarly, in a case of attaching a plurality of rear metal plates, a value obtained by summing up volumes of the respective rear metal plates is determined as the "Volume of rear metal plate".

For the first semiconductor module 10a, a volume ratio of (Volume of front metal plate)/(Volume of rear metal plate+Volume of portion of cooling fin attached to rear metal plate) preferably falls within a range from 0.3 to 1.5. If the volume ratio falls out of this range, it may be difficult to make the warp amount of the silicon nitride substrate smaller than 0.1 mm (0 mm included) when the silicon nitride substrate is built in the semiconductor module.

For example, assume that, the rear metal plate is 30 mm long by 30 mm wide, and the cooling fin has a size of 50 mm long by 50 mm wide by 2 mm thick, a volume of the portion of the rear metal plate attached to the cooling fin is 30 mm long by 30 mm wide by 2 mm thick=1800 mm$^3$. In such a manner, the volume ratio is to be determined using the volume of the portion of the cooling fin attached to the rear metal plate, rather than the volume of the cooling fin as a whole. In a case of using a plurality of front metal plates, volumes of the respective attached portions of the front metal plates are summed, and the sum is determined as the "Volume of front metal plate".

In a case where both of the leadframes and the cooling fin are attached, the first silicon nitride circuit board 1a is to be used when (Volume of portion of leadframe attached to front metal plate+Volume of front metal plate) (Volume of rear metal plate+Volume of portion of cooling fin attached to rear metal plate) is established. Alternatively, the second silicon nitride circuit board 1b is to be used when (Volume of portion of leadframe attached to front metal plate+Volume of front metal plate)<(Volume of rear metal plate+Volume of portion of cooling fin attached to rear metal plate) is established.

Next, a method for producing of the silicon nitride circuit board will be described. The producing method for the silicon nitride circuit board according to the embodiment does not have any limit, and is any method when the silicon nitride circuit board has the structure mentioned before. However, examples of a method to efficiently obtain the silicon nitride circuit board include the following method.

First, a silicon nitride substrate is prepared. The silicon nitride substrate is to be one having a three-point bending strength of 500 MPa or higher. The silicon nitride substrate preferably has a fracture toughness value of 6.0 MPa·m$^{1/2}$ or higher. In addition, the silicon nitride substrate preferably has a thermal conductivity of 50 W/m·K or higher.

The thermal conductivity is more preferably 50 W/m·K or higher, further 80 W/m·K or higher. The silicon nitride substrate preferably has a thickness of 0.1 mm or larger and 0.50 mm or smaller. Further, a thickness reduction down to 0.33 mm or smaller and 0.26 mm or smaller is preferably performed.

As to the warp amounts of the prepared silicon nitride substrate, the warp amount $S_{L1}$ in the long-side direction and the warp amount $S_{L2}$ in the short-side direction are both supposed to be less than 0.1 mm.

Next, metal plates are prepared. The metal plates are preferably one selected from copper plates, copper alloy plates, Al plates, and Al alloy plates. Thicknesses of the metal plates are specified so that relation between the thickness t1 of the front-side metal plate and the thickness t2 of the rear-side metal plate satisfies 0.10≤|t1−t2|≤0.30 mm. When the first silicon nitride circuit board 1a is used, t1>t2 is established, and when the second silicon nitride circuit board 1b is used, t1<t2 is established.

Next, a step of attaching the silicon nitride substrate and the metal plates is performed. The attachment (bonding) step is performed using an active metal brazing material. When the metal plates are copper plates or copper alloy plates, the active metal is supposed to contain one selected from Ti (titanium), Zr (zirconium), Hf (hafnium), and Nb (niobium). As the active metal, Ti is the most preferable. Components other than the active metal may include Ag, Cu, In, and Sn.

As the composition of the active metal brazing material, one that contains 40 to 80% by mass of Ag, 20 to 60% by mass of Cu, 0.1 to 12% by mass of Ti, 20% by mass or less (0 included) of Sn, and 20% by mass or less (0 included) of In is preferable.

In a case where the metal plates are Al plates or Al alloy plates, Al (aluminum) is an active metal. Examples of a component other than the active metal may include Si (silicon). As the composition of the active metal brazing material, for example, a brazing material that contains 0.01 to 10% by mass of Si, and Al as the remainder may be used.

The side surface of the metal plate is worked in advance so that, when a straight line is drawn from a point of ½ thickness of the metal plate to an edge portion of the metal plate on a silicon nitride substrate side, an angle θ between the straight line and the substrate surface is 80° or smaller. In addition, the metal plate may be treated by etching treatment after the attachment so that, when a straight line is drawn from a point of ½ thickness of the metal plate to an edge portion of the metal plate on a silicon nitride substrate side, an angle θ between the straight line and the substrate surface is 80° or smaller.

Meanwhile, a resin binder is added to the active metal brazing material, whereby an active metal brazing material paste is prepared. The active metal brazing material paste is applied onto the silicon nitride substrate, whereby an active metal brazing material paste layer is formed. On the active metal brazing material paste layer, the metal plate is disposed. In the case of providing a bulging-out portion of an attachment layer, the active metal brazing material paste layer is provided as one that is slightly larger than a size of the metal plate in the longitudinal and transverse directions.

An application thickness (coating thickness) of the active metal brazing material paste layer preferably falls within a range from 10 to 40 μm. A thickness of the active metal brazing material paste layer less than 10 μm leads to a risk that a sufficient attachment strength is not obtained. A large thickness of the active metal brazing material paste layer exceeding 40 μm not only results in a failure to obtain a further improved attachment strength but also becomes a cause of an increase in cost. Therefore, the thickness of the active metal brazing material paste layer preferably falls within a range from 10 to 40 μm, further 15 to 25 μm.

Next, a heating step is performed. A heating temperature preferably falls within a range from 600 to 900° C. In a case where the active metal brazing material contains one element selected from Ti, Zr, Hf, and Nb, an attachment temperature preferably falls within a range from 750 to 900° C. In a case where the active metal brazing material contains Al, the attachment temperature preferably falls within a range from 600 to 750° C. The heating step is preferably performed in a vacuum atmosphere. A degree of vacuum is preferably $1\times10^{-2}$ Pa or lower, further $4\times10^{-3}$ Pa or lower. By performing the heating step in the vacuum atmosphere, it is possible to prevent the copper plate or the active metal brazing material from being oxidized or nitrided.

By performing such steps, it is possible to manufacture a silicon nitride circuit board having a warp amount $S_{L1}$ in the long-side direction and a warp amount $S_{L2}$ in the short-side direction that fall within a range from 0.01 to 1.0 mm. In addition, a given warp amount may be provided to the silicon nitride circuit board as necessary by heating the silicon nitride circuit board while a stress is applied thereto.

In addition, patterning may be performed on the metal plates by etching treatment as necessary. The length W of the bulging-out portion of the brazing material and the angle θ on the side surface of the metal plate are to be adjusted in an etching step.

When the silicon nitride circuit board is built in the semiconductor module, the leadframes or the cooling fin is attached to the silicon nitride circuit board. The screwed structure is adopted as necessary.

Next, a semiconductor element is mounted on the metal plate on the front side (the front metal plate). The attachment of a heat dissipating member such as the leadframe and the attachment of the semiconductor element may be performed in a same step or in separated steps. The separated steps need not be performed in a particular order.

In a case where the attachment of the leadframes to the front metal plate and the attachment of the cooling fin to the rear metal plate are both performed, the first or second silicon nitride circuit board is used in accordance with an order of the attachments. When the leadframes are to be attached first, it is preferable to use the second silicon nitride circuit board 1b, which is convex on the front metal plate side. When the cooling fin is to be attached first, it is preferable to use the first silicon nitride circuit board 1a, which is convex on the rear metal plate side.

As necessary, a resin sealing step is performed. The resin sealing step is preferably performed by a transfer molding method. The transfer molding method is a method excellent in mass productivity. The silicon nitride circuit board according to the embodiment allows the warp amounts to be decreased even when resin sealing is performed by the transfer molding method.

EXAMPLES

Examples 1 to 6, Comparative Examples 1 to 3 and Reference Examples 1 to 2

As a silicon nitride substrate, a substrate having a thickness of 0.32 mm, a long-side direction length (L1) of 60 mm, a short-side direction length (L2) of 40 mm was prepared. The silicon nitride substrate had a three-point bending strength of 600 MPa, a thermal conductivity of 90 W/m·K, and a fracture toughness value of 6.5 MPa·m$^{1/2}$. Warp amounts of the silicon nitride substrate used before attachment of copper plates were a warp amount $S_{L1}$ in a long-side direction=0.02 mm, a warp amount $S_{L2}$ in a short-side direction=0.01 mm.

Next, as metal plates, copper plates were prepared. As a raw material of an active metal brazing material, a raw material mixture containing Ag (60 wt %), Cu (30 wt %), In (8 wt %), and Ti (2 wt %) was prepared. The raw material mixture and a resin binder were mixed together, whereby an active metal brazing material paste was prepared. To both surfaces of the silicon nitride substrate, the above active metal brazing material paste was applied (coated), the copper plates were disposed thereon, and the silicon nitride substrate was subjected to the heating step in which the silicon nitride substrate was heated in a vacuum atmosphere, at $1\times10^{-3}$ Pa or lower, at a temperature of 780 to 830° C. so that the copper plates were attached thereto.

By performing etching treatment on the front metal plate of the silicon nitride/copper circuit board subjected to the heating attachment, patterning was performed. By etching the side surfaces of the front metal plate and the rear metal plate, the length W of the bulging-out portion of the brazing material and the inclination angles θ on the side surfaces of the metal plates were controlled. Thereafter, by heating the silicon nitride/copper circuit board while a stress is applied thereto, adjustment was made so that a given warp amount was provided.

Sizes of the copper plates on the front side, sizes of the copper plates on the rear side, an inclination angle θ of side surface angles of the metal plates (copper plates), and bulging-out amounts of the active metal brazing material are shown in Table 1. The side surface angles of the metal plate were each determined as an angle θ between a substrate surface and a straight line drawn from a point of ½ thickness of the metal plate to an edge portion of the metal plate on the silicon nitride substrate side, as illustrated in FIG. 7. In each silicon nitride substrate to which a plurality of copper plates were attached, intervals between the copper plates were arranged to 1.2 mm.

TABLE 1

| Sample No. | Sizes of Copper Plate on Front Side (Length × Width × Thickness mm) | Sizes of Copper Plate on Rear Side (Length × Width × Thickness mm) | Side Surface Angle of Metal Plate θ (°) | Bulging-out Length of Active Metal Brazing Material W (μm) |
|---|---|---|---|---|
| Example 1 | Two Pieces of 50 × 15 × 0.7 | 50 × 30 × 0.6 | 60 | 20 |
| Example 2 | 40 × 25 × 1.0 | 40 × 30 × 0.8 | 40 | 30 |
| Example 3 | Three Pieces of 40 × 10 × 0.95 | 40 × 30 × 0.7 | 50 | 40 |
| Example 4 | 50 × 30 × 0.8 | 50 × 30 × 1.0 | 60 | 20 |
| Example 5 | Two Pieces of 35 × 15 × 0.6 | 50 × 45 × 0.7 | 45 | 40 |
| Example 6 | Two Pieces of 40 × 20 × 0.85 | 50 × 45 × 1.1 | 40 | 60 |
| Comparative Example 1 | 40 × 25 × 0.3 | 40 × 25 × 0.3 | 45 | 50 |
| Comparative Example 2 | 40 × 25 × 0.8 | 40 × 25 × 0.7 | 45 | 50 |
| Comparative Example 3 | 40 × 95 × 0.7 | 40 × 25 × 0.8 | 45 | 50 |
| Reference Example 1 | Two Pieces of 50 × 15 × 0.7 | 50 × 30 × 0.6 | 84 | 20 |
| Reference Example 2 | Two Pieces of 50 × 15 × 0.7 | 50 × 30 × 0.6 | 60 | 2 |

For the silicon nitride circuit boards obtained by the producing method described above, the warp amount $S_{L1}$ in the long-side direction, the warp amount $S_{L2}$ in the short-side direction, and a direction of a warp were measured. The measurement of the warp amount was performed by drawing a straight line from one of opposite edges of the silicon nitride substrate to another one, as shown in FIG. 2, and determining the warp amount as a distance at which the silicon nitride substrate is most away from the straight line. In addition, the warp amount $S_{L3}$ in the diagonal line direction was also measured. Results of the measurement are shown in Table 2.

TABLE 2

| Sample No. | Warp Amount SL1 in Long Side Direction (mm) | Warp Amount SL2 in Short Side Direction (mm) | Ratio ($S_{L1}/S_{L2}$) | Warp Amount SL3 in Diagonal Line Direction (mm) | Direction of Warp |
|---|---|---|---|---|---|
| Example 1 | 0.2 | 0.2 | 1.0 | 0.2 | Convex toward Rear Side |
| Example 2 | 0.4 | 0.2 | 2.0 | 0.4 | Convex toward Rear Side |
| Example 3 | 0.3 | 0.1 | 1.0 | 0.3 | Convex toward Rear Side |
| Example 4 | 0.1 | 0.1 | 1.0 | 0.2 | Convex toward Front Side |
| Example 5 | 0.4 | 0.2 | 2.0 | 0.4 | Convex toward Front Side |
| Example 6 | 0.3 | 0.1 | 3.0 | 0.3 | Convex toward Front Side |
| Comparative Example 1 | 0.0 | 0.0 | — | 0.0 | None Warp |
| Comparative Example 2 | 1.1 | 0.1 | 11.0 | 1.0 | Convex toward Rear Side |
| Comparative Example 3 | 1.1 | 0.2 | 3.5 | 1.6 | Convex toward Front Side |
| Reference Example 1 | 0.2 | 0.2 | 1.0 | 0.2 | Convex toward Rear Side |
| Reference Example 2 | 0.2 | 0.2 | 1.0 | 0.2 | Convex toward Rear Side |

Examples 1 to 3 are related to the first silicon nitride circuit board. Examples 4 to 6 are related to the second silicon nitride circuit board. Comparative example 1 has no warp. Comparative Example 2 and Comparative Example 3 have large warp amounts. Reference Example 1 shows a case where the angle in the edge portion of the metal plate is excessively large, and Reference Example 2 shows a case where the length of the bulging-out portion of the brazing material is excessively short.

Examples 7 to 10

As silicon nitride substrates, substrates having specifications shown in Table 3 were prepared. As to warp amounts of the substrates, warp amounts in the long-side direction were 0.02 mm or smaller, and warp amounts in the short-side direction were 0.02 mm or smaller. The step of attaching metal plates was the same as that in Example 1.

TABLE 3

| Sample No. | Sizes of Substrate (Length × Width × Thickness mm) | Three-Point Bending Strength (MPa) | Thermal Conductivity (W/m · K) | Fracture Toughness Value (MPa · m$^{1/2}$) |
|---|---|---|---|---|
| Example 7 | 200 × 100 × 0.32 | 700 | 50 | 7.2 |
| Example 8 | 100 × 80 × 0.25 | 650 | 80 | 6.0 |
| Example 9 | 30 × 20 × 0.25 | 680 | 90 | 6.3 |
| Example 10 | 60 × 40 × 0.25 | 750 | 95 | 6.5 |

Next, copper plates shown in left columns of Table 4 were attached on a front side and a rear side of each of the silicon nitride substrates. The angle θ on the side surface of the metal plate and the length W of the bulging-out portion of the brazing material were controlled by etching treatment. In each silicon nitride substrate to which a plurality of copper plates were attached, distances between adjacent copper plates were arranged to 1.2 mm. Thereafter, a given warp amount was provided to each silicon nitride substrate by heating the silicon nitride substrate while a stress is applied thereto.

TABLE 4

| Sample No. | Sizes of Copper Plate on Front Side (Length × Width × Thickness mm) | Sizes of Copper Plate on Rear Side (Length × Width × Thickness mm) | Side Surface Angle of Metal Plate θ (°) | Bulging-out Length of Active Metal Brazing Material W (μm) |
|---|---|---|---|---|
| Example 7 | Three Pieces of 30 × 30 × 1.0 | 180 × 80 × 0.8 | 45 | 30 |
| Example 8 | 40 × 25 × 0.9. 20 × 20 × 0.9 | 104 × 84 × 0.8 | 40 | 40 |
| Example 9 | 20 × 15 × 1.0 | 40 × 30 × 0.8 | 60 | 20 |
| Example 10 | 40 × 30 × 0.8 | 50 × 30 × 0.95 | 50 | 25 |

For the obtained silicon nitride circuit boards, the warp amount $S_{L1}$ in the long-side direction, the warp amount $S_{L2}$ in the short-side direction, the warp amount $S_{L3}$ in the diagonal line direction, and a direction of a warp were measured. The measurement of the warp amount was performed by drawing a straight line from one of opposite edges of the silicon nitride substrate to another one, as shown in FIG. 2, and determining the warp amount as a distance at which the silicon nitride substrate is most away from the straight line. Results of the measurement are shown in Table 5 below.

TABLE 5

| Sample No. | Warp Amount in Long Side Direction $S_{L1}$ (mm) | Warp Amount in Short Side Direction $S_{L2}$ (mm) | Ratio ($S_{L1}/S_{L2}$) | Warp Amopunt in Diagonal Line Direction $S_{L3}$ (mm) | Direction of Warp |
|---|---|---|---|---|---|
| Example 7 | 0.18 | 0.15 | 1.2 | 0.19 | Convex toward Front Side |
| Example 8 | 0.35 | 0.14 | 2.5 | 0.33 | Convex toward Rear Side |
| Example 9 | 0.18 | 0.10 | 1.8 | 0.20 | Convex toward Front Side |
| Example 10 | 0.42 | 0.15 | 2.8 | 0.45 | Convex toward Front Side |

Example 8 is an example of the first silicon nitride circuit board 1*a*. Examples 7, 9, and 10 are examples of the second silicon nitride circuit board 1*b*.

Next, in Examples 1 to 10, Comparative Examples 1 to 3, and Reference Examples 1 to 2, TCT properties of the silicon nitride circuit boards were measured. The TCT (thermal cycling test) was conducted with a thermal cycle thereof including a retention at a temperature of −40° C.×30 min→a retention at a room temperature (25° C.)×10 min→a retention at a temperature of 175° C.×30 min→a retention at a room temperature (25° C.)×10 min, as 1 cycle, and presence/absence of peeling in the metal plate and occurrence of a crack in the silicon nitride substrate after 500 cycles and 1500 cycles were measured. Results of the measurement are shown in Table 6 below.

TABLE 6

| | TCT (Presence/Absence of Peeling in Metal Plate and Occurrence of Crack in Silicon Nitride Substrate) | |
|---|---|---|
| Sample No. | 1500 Cycles | 500 Cycles |
| Example 1 | None | None |
| Example 2 | None | None |
| Example 3 | None | None |
| Example 4 | None | None |

TABLE 6-continued

| | TCT (Presence/Absence of Peeling in Metal Plate and Occurrence of Crack in Silicon Nitride Substrate) | |
| --- | --- | --- |
| Sample No. | 1500 Cycles | 500 Cycles |
| Example 5 | None | None |
| Example 6 | None | None |
| Comparative Example 1 | None | None |
| Comparative Example 2 | None | None |
| Comparative Example 3 | None | None |
| Reference Example 1 | Observed | None |
| Reference Example 2 | Observed | None |
| Example 7 | None | None |
| Example 8 | None | None |

Comparative Example 2A were manufactured by attaching cooling fins. As Reference Example 4, a semiconductor module was manufactured by attaching a cooling fin to a first silicon nitride circuit board (Example 4). The cooling fins were manufactured using copper plates.

In each of the semiconductor modules, a warp amount of a silicon nitride substrate was measured. In addition, a TCT property of each semiconductor module was measured. As to the TCT properties, the TCT (thermal cycle test) was conducted with 1 cycle including a retention at a temperature of −40° C.×30 min→a retention at a room temperature (25° C.)×10 min→a retention at a temperature of 200° C.×30 min→a retention at a room temperature (25° C.)×10 min, and presence/absence of a flaw such as peeling in the metal plate and occurrence of a crack after 1000 cycles were performed were investigated. Results of the measurement and investigation are shown in Table 7 below.

TABLE 7

| | | | Warp Amount of Silicon Nitride Substrate | | |
| --- | --- | --- | --- | --- | --- |
| Sample No. | Silicon Nitride Circuit Board | Cooling Fin (Length × Width × Thickness mm) | Warp Amount in long side Direction $S_{L1}$ (mm) | Warp Amount in Short Side Direction $S_{L2}$ (mm) | TCT Presence/Absence of Flaw after 1000 Cycles |
| Example 1A | Example 1 | 50 × 30 × 5 | 0.02 | 0.02 | None |
| Example 2A | Example 2 | 50 × 30 × 10 | 0.01 | 0.01 | None |
| Example 3A | Example 3 | 45 × 30 × 2 | 0.03 | 0.02 | None |
| Example 8A | Example 8 | 40 × 30 × 5 | 0.04 | 0.02 | None |
| Comparative Example 1A | Comparative Example 1 | 50 × 30 × 5 | 0.75 | 0.52 | Observed |
| Comparative Example 2A | Comparative Example 2 | 50 × 30 × 5 | 1.59 | 1.21 | Observed |
| Reference Example 4 | Example 4 | 50 × 30 × 5 | −2.04 | −1.48 | Observed |

TABLE 6-continued

| | TCT (Presence/Absence of Peeling in Metal Plate and Occurrence of Crack in Silicon Nitride Substrate) | |
| --- | --- | --- |
| Sample No. | 1500 Cycles | 500 Cycles |
| Example 9 | None | None |
| Example 10 | None | None |

As is clear from the results shown in Table 6, the silicon nitride circuit board in each of Examples and Comparative Examples was excellent in TCT property. In addition, it was confirmed that the angle θ on the side surface of the metal plate and the length W of the bulging-out portion of the brazing material need to be controlled so as to allow the circuit board to exert its durability sufficiently, in particular for a long term, 1500 cycles.

Examples 1A to 3A, Example 8A, Comparative Example 1A, Comparative Example 2A, and Reference Example 4

By attaching a cooling fin to a rear metal plate of each of the first silicon nitride circuit boards (Examples 1 to 3 and 8), second semiconductor modules 10b related to Example 1A to 3A, and Example 8A were manufactured. Also in Comparative Example 1 and Comparative Example 2, semiconductor modules related to Comparative Example 1A and As is clear from the results shown in Table 7 above, the silicon nitride circuit board in each of Examples has a warp amount of a silicon nitride substrate of smaller than 0.10 mm after the attachment of the cooling fin. As a result, the silicon nitride circuit board was also excellent in TCT property. In contrast, Comparative Example 1 and Comparative Example 2 had large warp amounts and resulted in poor TCT properties. In a case of a semiconductor module having an inverse warping direction, as in Reference Example 4, contrarily resulted in a large warp on the rear side of its substrate (its warp amounts are shown as negative values). This case also resulted in a poor TCT property. It was found that, in a semiconductor module having a large warp, as in Comparative Examples and Reference Example, a stress acted on its silicon nitride substrate when a screwed structure was set up, resulting in a poor TCT property.

Therefore, it can be understood that the first silicon nitride circuit board is useful and suitable for a structure in which a cooling fin is attached to a front metal plate.

Examples 4B to 6B, 7B, 9B, and 10B, Comparative Examples 1B and 3B, Reference Example 3

By attaching leadframes to a front metal plate of each of the second silicon nitride circuit boards (Examples 4 to 6, 7, 9, and 10), semiconductor modules related to Examples 4B to 6B, 7B, 9B, and 10B were manufactured. Also for the silicon nitride circuit board related to Comparative Examples 1 and 3, semiconductor modules related to Comparative Examples 1B and 3B were manufactured by attaching leadframes. Further, as Reference Example 3, a semiconductor module was manufactured by attaching leadframes to a first silicon nitride circuit board (Example 1). The leadframes were manufactured using copper plates.

In each of the semiconductor modules, a warp amount of a silicon nitride substrate was measured. In addition, a TCT property of each semiconductor module was also measured. Here, as to the TCT properties, the TCT (thermal cycle test) was conducted with 1 cycle including a retention at a temperature of −40° C.×30 min→a retention at a room temperature (25° C.)×10 min→a retention at a temperature of 200° C.×30 min→a retention at a room temperature (25° C.)×10 min, and presence/absence of peeling in the metal plate and occurrence of a crack after 1000 cycles were performed were investigated. Results of the measurement and investigation are shown in Table 8 below.

TABLE 8

| Sample No. | Silicon Nitride Circuit Board | Leadframe (Length × Width × Thickness mm) | Warp Amount in Long Side Direction $S_{L1}$ (mm) | Warp Amount in Short Side Direction $S_{L2}$ (mm) | TCT Presence/Absence of Flaw after 1000 Cycles |
|---|---|---|---|---|---|
| Example 4B | Example 4 | Two Pieces of 40 × 5 × 0.4 | 0.05 | 0.02 | None |
| Example 5B | Example 5 | Two Pieces of 50 × 10 × 1.0 for each Metal Plate (Total 4 Pieces) | 0.08 | 0.06 | None |
| Example 6B | Example 6 | Two Pieces of 30 × 4 × 0.5 for each Metal Plate (Total 4 Pieces) | 0.04 | 0.03 | None |
| Example 7B | Example 7 | Two Pieces of 20 × 5 × 0.5 for each Metal Plate (Total 6 Pieces) | 0.05 | 0.04 | None |
| Example 9B | Example 9 | Two Pieces of 20 × 5 × 0.6 for each Metal Plate (Total 4 Pieces) | 0.08 | 0.05 | None |
| Example 10B | Example 10 | Two Pieces of 50 × 10 × 1.0 | 0.04 | 0.03 | None |
| Comparative Example 1B | Comparative Example 1 | Two Pieces of 50 × 10 × 1.0 | 0.63 | 0.46 | Observed |
| Comparative Example 3B | Comparative Example 3 | Two Pieces of 50 × 10 × 1.0 | 1.34 | 0.87 | Observed |
| Reference Example 3 | Example 1 | Two Pieces of 50 × 10 × 1.0 | −1.55 | −1.20 | Observed |

As is clear from the results shown in Table 8 above, the semiconductor module in each of Examples showed warp amounts of its silicon nitride substrate of smaller than 0.10 mm after the attachment of the leadframes. Consequently, the semiconductor module was excellent also in TCT property. In contrast, Comparative Example 1 and Comparative Example 2 have large warp amounts, resulting in poor TCT properties. In a case of a semiconductor module having an inverse warping direction, as in Reference Example 3, contrarily resulted in a large warp on the rear side of its substrate (its warp amounts are shown as negative values). This case also resulted in a poor TCT property. Therefore, it was found that the second silicon nitride circuit board is useful for a module structure in which leadframes are attached to a front metal plate.

Several embodiments of the present invention are illustrated above. However, these embodiments are presented by way of example only and not intended to limit the scope of the invention. These novel embodiments can be implemented in other various forms. Various omissions, substitutions, alterations, and the like of the embodiments can be made without departing from the gist of the invention. These embodiments and modifications thereof are included in the scope and the gist of the invention and included in the inventions described in claims and a scope of equivalents of the inventions. The embodiments described above can be implemented in combination with one another.

REFERENCE SIGNS LIST

1 silicon nitride circuit board
1a first silicon nitride circuit board
1b second silicon nitride circuit board
2 silicon nitride substrate
3 metal plate on front side
L1 length of the silicon nitride substrate in a long-side direction
L2 length of the silicon nitride substrate in a short-side direction
L3 length of the silicon nitride substrate in a diagonal line direction
4 metal plate on rear side
S warp amount of the silicon nitride substrate
$S_{L1}$ warp amount of the silicon nitride substrate in the long-side direction
$S_{L2}$ warp amount of the silicon nitride substrate in the short-side direction
$S_{L3}$ warp amount of the silicon nitride substrate in the diagonal line direction
5 semiconductor element
6 leadframe
7 cooling fin 8 screw
9 screw receiving portion
10 semiconductor module
10a first semiconductor module
10b second semiconductor module
11 bulging-out portion of the attachment layer (brazing material layer)
θ angle on the side surface of the metal plate
W length of the bulging-out portion of the attachment layer

The invention claimed is:

1. A silicon nitride circuit board in which metal plates are attached on front and rear sides of a silicon nitride substrate having a three-point bending strength of 500 MPa or higher and a thickness of 0.50 mm or less, with attachment layers interposed therebetween, wherein
a thickness of the metal plate on the front side is denoted by t1, and a thickness of the metal plate on the rear side is denoted by t2, at least one of the thicknesses t1 and t2 is 0.6 mm or larger, a numerical relation: $0.10 \leq |t1-t2| \leq 0.30$ mm is satisfied, and
warp amounts of the silicon nitride substrate in a long-side direction and a short-side direction both fall within a range from 0 to 1.0 mm, and a warp amount at the silicon nitride substrate in the long-side direction is denoted by $S_{L1}$, and a warp amount of the silicon nitride substrate in the short-side direction is denoted by $S_{L2}$, a ratio ($S_{L1}/S_{L2}$) falls within a range from 0.5 to 5.0.

2. The silicon nitride circuit board according to claim 1, wherein a longitudinal width (L1) of the silicon nitride substrate falls within a range from 10 to 200 mm, and a transverse width (L2) of the silicon nitride substrate falls within a range from 10 to 200 mm.

3. The silicon nitride circuit board according to claim 1, wherein a warp amount in the diagonal line length direction of the silicon nitride substrate is denoted by $S_{L3}$, $S_{L3}$ falls within a range of $0.1 \leq S_{L3} \leq 1.5$ mm.

4. The silicon nitride circuit board according to claim 1, wherein t1>t2 is satisfied, and the silicon nitride circuit board warps so as to be convex toward the rear side.

5. A semiconductor module comprising a structure in which the metal plate attached on the rear side of the silicon nitride circuit board according to claim 4 is attached to a cooling fin.

6. The semiconductor module according to claim 5, wherein the structure further comprises the silicon nitride circuit board and the cooling fin being screwed together.

7. The semiconductor module according to claim 6, wherein the warp amount in the long-side direction and the warp amount in the short-side direction of the silicon nitride substrate both fall within a range from 0 to 0.1 mm.

8. The semiconductor module according to claim 5, wherein the warp amount in the long-side direction and the warp amount in the short-side direction of the silicon nitride substrate both fall within a range from 0 to 0.1 mm.

9. The silicon nitride circuit board according to claim 1, wherein t1<t2 is satisfied, and the silicon nitride circuit board warps so as to be convex toward the front side.

10. A semiconductor module comprising a structure in which a leadframe is attached to the metal plate attached on the front side of the silicon nitride circuit board according to claim 9.

11. The semiconductor module according to claim 10, wherein a thickness of the leadframe is 0.2 mm or larger.

12. The semiconductor module according to claim 11, wherein the warp amount in the long-side direction and the warp amount in the short-side direction of the silicon nitride substrate both fall within a range from 0 to 0.1 mm.

13. The semiconductor module according to claim 10, wherein the warp amount in the long-side direction and the warp amount in the short-side direction of the silicon nitride substrate both fall within a range from 0 to 0.1 mm.

14. The silicon nitride circuit board according to claim 1, wherein a length of a bulging-out portion of the attachment layer bulging out from an edge portion of the metal plate falls within a range from 10 to 150 μm.

15. The silicon nitride circuit board according to claim 1, wherein on a side surface of the metal plate, when a straight line is drawn from a point of ½ thickness of the metal plate to an edge portion of the metal plate on a silicon nitride substrate side, the straight line and a plane direction of the silicon nitride substrate form an angle of 80° or smaller.

16. The silicon nitride circuit board according to claim 1, wherein the silicon nitride substrate has a thermal conductivity of 50 W/m·K or higher.

17. The semiconductor module according to claim 1, wherein the silicon nitride substrate has a thermal conductivity of 80 W/m-K or higher.

18. The semiconductor module according to claim 1, wherein the silicon nitride substrate has a thickness of 0.33 mm or less.

19. The semiconductor module according to claim 1, wherein the silicon nitride substrate has a thickness of 0.33 mm or less and a thermal conductivity of 80 W/m-k or higher.

* * * * *